United States Patent
Forster

(10) Patent No.: US 9,373,070 B2
(45) Date of Patent: Jun. 21, 2016

(54) USE OF RFID CHIP AS ASSEMBLY FACILITATOR

(71) Applicant: Avery Dennison Retail Information Services, LLC, Mentor, OH (US)

(72) Inventor: Ian James Forster, Essex (GB)

(73) Assignee: Avery Dennison Corporation, Glendale, CA (US)

( * ) Notice: Subject to any disclaimer, the term of this patent is extended or adjusted under 35 U.S.C. 154(b) by 0 days.

(21) Appl. No.: 14/450,970

(22) Filed: Aug. 4, 2014

(65) Prior Publication Data

US 2016/0034807 A1 Feb. 4, 2016

(51) Int. Cl.
  *G06K 19/06* (2006.01)
  *G06K 19/077* (2006.01)
  *B32B 37/18* (2006.01)
  *B32B 37/12* (2006.01)
  *B32B 38/00* (2006.01)
  *B32B 41/00* (2006.01)
  *H01L 23/00* (2006.01)

(52) U.S. Cl.
  CPC ........ *G06K 19/0772* (2013.01); *B32B 37/1207* (2013.01); *B32B 37/18* (2013.01); *B32B 38/0008* (2013.01); *B32B 41/00* (2013.01); *G06K 19/07735* (2013.01); *G06K 19/07745* (2013.01); *G06K 19/07747* (2013.01); *G06K 19/07754* (2013.01); *G06K 19/07773* (2013.01); *H01L 24/81* (2013.01); *H01L 24/83* (2013.01); *B32B 2307/202* (2013.01); *B32B 2309/02* (2013.01); *B32B 2310/022* (2013.01); *B32B 2519/02* (2013.01); *H01L 2224/81191* (2013.01); *H01L 2224/81903* (2013.01); *H01L 2224/83192* (2013.01); *H01L 2224/83234* (2013.01); *H01L 2224/83862* (2013.01)

(58) Field of Classification Search
  CPC ......... G06K 5/00; G06K 19/00; G06K 19/06; G06K 7/08; G06K 21/00; G06F 17/00
  USPC .......................... 235/492, 380, 487, 375, 488
  See application file for complete search history.

(56) References Cited

U.S. PATENT DOCUMENTS 6,107,920 A   8/2000   Eberhardt et al.
6,126,428 A   10/2000  Mitchell et al.
(Continued)

FOREIGN PATENT DOCUMENTS

DE   102006052518   5/2008

*Primary Examiner* — Edwyn Labaze
(74) *Attorney, Agent, or Firm* — Avery Dennison Retail Information Services LLC

(57) ABSTRACT

A method of assembling RFID components together while using an RFID chip that heats internally in order to assemble that RFID chip and another RFID component such as an antenna is followed while producing RFID assemblies or RFID devices. This RFID chip is associated with a member that has an electrical characteristic to develop heat internal of this RFID chip. An uncured adhesive is positioned between at least a portion of the RFID chip and a portion of the other RFID component. Action of the RFID chip internal member heats the RFID chip, heat emanating to the adhesive, resulting in adhesive curing into a cured adhesive joint attaching together the RFID chip and the other RFID component. This assembly is capable of being achieved without an external source of heat or pressure applied to the adhesive. Temperature monitoring is available to assess heat development in connection with threshold temperature designation.

18 Claims, 3 Drawing Sheets

(56) References Cited

U.S. PATENT DOCUMENTS

| | | |
|---|---|---|
| 6,206,292 B1 | 3/2001 | Robertz et al. |
| 6,262,692 B1 | 7/2001 | Babb |
| 7,056,767 B2 | 6/2006 | Liang et al. |
| 7,500,610 B1* | 3/2009 | Hadley et al. ............... 235/451 |
| 8,171,624 B2 | 5/2012 | Forster et al. |
| 8,193,040 B2 | 6/2012 | Meyer-Berg |
| 2003/0132528 A1 | 7/2003 | Liang et al. |
| 2006/0163743 A1* | 7/2006 | Kuwabara et al. ........... 257/773 |
| 2006/0238989 A1* | 10/2006 | Manes et al. .................. 361/760 |
| 2007/0007344 A1 | 1/2007 | Ihoue et al. |
| 2007/0103311 A1* | 5/2007 | Kippelen ........... G06K 19/0723 340/572.8 |
| 2010/0127359 A1* | 5/2010 | Bazarjani ............... H01L 23/60 257/659 |
| 2011/0057846 A1 | 3/2011 | Scattergood |
| 2011/0121947 A1* | 5/2011 | Kubota et al. ................ 340/10.1 |
| 2011/0147466 A1* | 6/2011 | Kang et al. .................. 235/492 |
| 2012/0040128 A1 | 2/2012 | Finn |
| 2013/0264390 A1* | 10/2013 | Frey et al. .................... 235/492 |

* cited by examiner

USE OF RFID CHIP AS ASSEMBLY FACILITATOR

BACKGROUND

1. Field of the Disclosure

The present subject matter relates to the assembly of components for making radio frequency identification ("RFID") devices, more particularly using RFID chips themselves to facilitate assembly of RFID devices and the devices thus assembled.

2. Description of Related Art

RFID tags and labels (collectively referred to herein as "devices") are widely used to associate an object with an identification code. RFID devices generally have a combination of antennas and analog and/or digital electronics, which may include, for example, communications electronics, data memory, and control logic. RFID devices typically are used in conjunction with retail security systems, security locks and ignitions in vehicles, for access control to buildings, and for tracking inventory and parcels. Some examples of RFID tags and labels appear in U.S. Pat. No. 6,107,920; U.S. Pat. No. 6,206,292; and U.S. Pat. No. 6,262,692, all of which are hereby incorporated herein by reference in their entireties.

Automatic identification of products using RFID technology has become ubiquitous. RFID technology devices include electronic components that respond to radio frequency ("RC") commands and signals to provide identification of each device wirelessly. Generally, RFID tags and labels comprise an integrated circuit ("IC", or chip) attached to an antenna that responds to a reader using radio waves to store and access the information in the chip. Specifically, RFID tags and labels have a combination of antennas and analog and/or digital electronics, which often includes communications electronics, data memory, and control logic.

One of the obstacles to more widespread adoption of RFID technology is that the cost of RFID devices, particularly tags, and difficulties for optimization of economical manufacturing of RFID tags. Increased demand for RFID tags has manufacturers seeking cost reduction and manufacturing simplification. Assembly difficulties tend to increase as RFID chips and their components become smaller. For example, to interconnect the relatively small contact pads on the chips with the antennas, intermediate structures variously referred to as "straps," "interposers," and "carriers" are sometimes used to facilitate inlay manufacture. Interposers include conductive leads or pads that are electrically coupled to the contact pads of the chips for coupling to the antennas. Small RFID components need to be assembled, at times through the use of adhesives. Often those adhesives require the application of energy in order to transform them from their uncured state to a cured state at which they hold two or more components together in the course of making, storing, transporting and using the finished RFID device. Usually, this assembly procedure must meet a requirement of providing effective electrical connection between the chip and the antenna.

Typically the various elements that are assembled to form a complete RFID device are provided arranged on linear arrays such as on a substrate, tape or web. The respective webs are directed to a joining location and then are assembled together by application of heat (or other energy sources) and pressure to uncured adhesives, which energy and compression are maintained for a length of time during the assembly process until the adhesive is sufficiently cured and the components securely held together by a cured adhesive joint. This requires a separate curing and compression action during the course of the assembly operation, which can be especially problematic and capital intensive to implement measures and provide equipment that accommodate moving webs and other production details preferred for high-speed assembly manufacturing of very small components into small RFID devices which must be achieved without significant reduction in RFID operation and effectiveness.

For example, a typical method of attaching RFID chips to straps or antennas (or other components) involves multiple steps including: (a) picking the chip off the wafer, (b) flipping the chip so it is held by its back surface, (c) placing the chip onto the strap or antenna with its connections oriented over bond pads, (d) placing onto an adhesive, which can be a non-conducting or an anisotropic material, and (e) curing the adhesive by placing a metal block, referred to as a "thermode", on top, which applied heat and pressure typically is in conjunction with a heater below the web. Transferring heat via conduction through the silicon and/or the plastic substrate is relatively slow, and curing time can be a significant factor in the throughput in units per time period of production during the manufacturing process.

SUMMARY

There are several aspects of the present subject matter which may be embodied separately or together in the devices and systems described and claimed below. These aspects may be employed alone or in combination with other aspects of the subject matter described herein, and the description of these aspects together is not intended to preclude the use of these aspects separately or the claiming of such aspects separately or in different combinations as may be set forth in the claims appended hereto.

In one aspect, an embodiment concerns a method of assembling RFID components together while using an RFID chip that itself facilitates and/or participates in assembly of the RFID chip to another RFID device component, and RFID assemblies or devices incorporating such RFID chips. An RFID chip is provided that includes a member having an electrical characteristic that imparts heat by electrical action internal of the RFID chip. At least one other RFID component, such as an antenna component, that is adapted to be assembled to the RFID chip is positioned for attachment to the RFID chip, with an uncured adhesive positioned for attaching the RFID chip and the other RFID component. Action of the RFID chip itself, particularly of its member having an electrical characteristic, heats the RFID chip and the adhesive thereby curing the adhesive into an adhesive joint assembling the RFID chip and the other RFID component.

In another aspect, an embodiment concerns a method of assembling RFID components together while using an RFID chip that itself facilitates and/or participates in assembly of the RFID chip to another RFID device component, and RFID assemblies or devices incorporating such RFID chips. An RFID chip is provided that includes a member having an electrical characteristic that imparts heat by electrical action internal of the RFID chip. At least one other RFID component, such as an antenna component, that is adapted to be assembled to the RFID chip is positioned for attachment to the RFID chip, with an uncured adhesive positioned for attaching the RFID chip and the other RFID component. Action of the RFID chip itself, particularly of its member having an electrical characteristic, heats the RFID chip and the adhesive thereby curing the adhesive into an adhesive joint assembling the RFID chip and the other RFID component. This is achieved without an external source of heat and/or pressure applied to the adhesive or the chip and component thus assembled.

In a further aspect, another embodiment concerns a method of assembling RFID components together while using an RFID chip that itself facilitates and/or participates in assembly of the RFID chip to another RFID device component, and RFID assemblies or devices incorporating such RFID chips. An RFID chip is provided that includes at least one internal electrostatic discharge (ESD) diode having an electrical characteristic that imparts heat by electrical action internal of the RFID chip. At least one other RFID component, such as an antenna component, that is adapted to be assembled to the RFID chip is positioned for attachment to the RFID chip, with an uncured adhesive positioned for attaching the RFID chip and the other RFID component. Action of the RFID chip itself, particularly of its member having an electrical characteristic, heats the RFID chip and the adhesive thereby curing the adhesive into an adhesive joint assembling the RFID chip and the other RFID component.

An added embodiment concerns a method of assembling RFID components together while using an RFID chip that itself facilitates and/or participates in assembly of the RFID chip to another RFID device component, and RFID assemblies or devices incorporating such RFID chips. An RFID chip is provided that includes at least one resistor having an electrical characteristic that imparts heat by electrical action internal of the RFID chip. At least one other RFID component, such as an antenna component, that is adapted to be assembled to the RFID chip is positioned for attachment to the RFID chip, with an uncured adhesive positioned for attaching the RFID chip and the other RFID component. Action of the RFID chip itself, particularly of its member having an electrical characteristic, heats the RFID chip and the adhesive thereby curing the adhesive into an adhesive joint assembling the RFID chip and the other RFID component.

According to another aspect, an embodiment concerns a method of assembling RFID components together while using an RFID chip that itself facilitates and/or participates in assembly of the RFID chip to another RFID device component, and RFID assemblies or devices incorporating such RFID chips. An RFID chip is provided that includes at least one FET having an electrical characteristic that imparts heat by electrical action internal of the RFID chip. At least one other RFID component, such as an antenna component, that is adapted to be assembled to the RFID chip is positioned for attachment to the RFID chip, with an uncured adhesive positioned for attaching the RFID chip and the other RFID component. Action of the RFID chip itself, particularly of its member having an electrical characteristic, heats the RFID chip and the adhesive thereby curing the adhesive into an adhesive joint assembling the RFID chip and the other RFID component.

In a further aspect, an embodiment concerns a method of assembling RFID components together while using an RFID chip with an inbuilt temperature sensor in connection with assembly of the RFID chip to another RFID device component, and RFID assemblies or devices incorporating such RFID chips. At least one other RFID component, such as an antenna component, that is adapted to be assembled to the RFID chip is positioned for attachment to the RFID chip, with an uncured adhesive positioned for attaching the RFID chip and the other RFID component. A tool for placing the RFID chip to an assembly position includes a source of energy, which is directed to the RFID chip, heats the chip and consequently the uncured adhesive thereby curing the adhesive into an adhesive joint assembling the RFID chip and the other RFID component. The inbuilt temperature sensor monitors the temperature of the RFID chip and initiates feedback to the source of energy to control the source of energy for heating and/or ceasing heating of the RFID chip in connection with curing the adhesive and forming the adhesive joint.

In another aspect, an embodiment concerns a method of assembling RFID components together while using an RFID chip having a member that itself facilitates and/or participates in assembly of the RFID chip to another RFID device component, and RFID assemblies or devices incorporating such RFID chips. The RFID chip member has an inbuilt chip diode. At least one other RFID component, such as an antenna component, that is adapted to be assembled to the RFID chip is positioned for attachment to the RFID chip, with an uncured adhesive positioned for attaching the RFID chip and the other RFID component. A tool for placing the RFID chip to an assembly position includes a source of energy, which is directed to the RFID chip, heats the chip and consequently the uncured adhesive thereby curing the adhesive into an adhesive joint assembling the RFID chip and the other RFID component. The voltage of the chip diode is measured for the purpose of monitoring the temperature of the RFID chip and initiate feedback to the source of energy to control the source of energy for heating and/or ceasing heating of the RFID chip in connection with curing the adhesive and forming the adhesive joint.

In a further aspect, an embodiment concerns a method of assembling RFID components together while using an RFID chip with an inbuilt temperature sensor in connection with assembly of the RFID chip to another RFID device component, and RFID assemblies or devices incorporating such RFID chips. At least one other RFID component, such as an antenna component, that is adapted to be assembled to the RFID chip is positioned for attachment to the RFID chip, with an uncured adhesive positioned for attaching the RFID chip and the other RFID component. A tool for placing the RFID chip to an assembly position focuses an external source of energy onto the RFID chip and ceasing this energy focus when a threshold temperature is reached. The focused energy heats the chip and consequently the uncured adhesive thereby curing the adhesive into an adhesive joint assembling the RFID chip and the other RFID component. The inbuilt temperature sensor monitors the temperature of the RFID chip and initiates feedback to the source of energy to control the source of energy for heating and/or ceasing heating of the RFID chip in connection with curing the adhesive and forming the adhesive joint.

An added embodiment concerns a method of assembling RFID components together while using an RFID chip having a member that itself facilitates and/or participates in assembly of the RFID chip to another RFID device component, and RFID assemblies or devices incorporating such RFID chips. The RFID chip member has an inbuilt chip diode. At least one other RFID component, such as an antenna component, that is adapted to be assembled to the RFID chip is positioned for attachment to the RFID chip, with an uncured adhesive positioned for attaching the RFID chip and the other RFID component. A tool for placing the RFID chip to an assembly position focuses an external source of energy onto the RFID chip and ceasing this energy focus when a threshold temperature is reached. The focused energy heats the chip and consequently the uncured adhesive thereby curing the adhesive into an adhesive joint assembling the RFID chip and the other RFID component. The voltage of the chip diode is measured for the purpose of monitoring the temperature of the RFID chip and initiate feedback to the source of energy to control the source of energy for heating and/or ceasing heating of the RFID chip in connection with curing the adhesive and forming the adhesive joint.

DESCRIPTION OF THE ILLUSTRATED EMBODIMENTS

Figure 1:
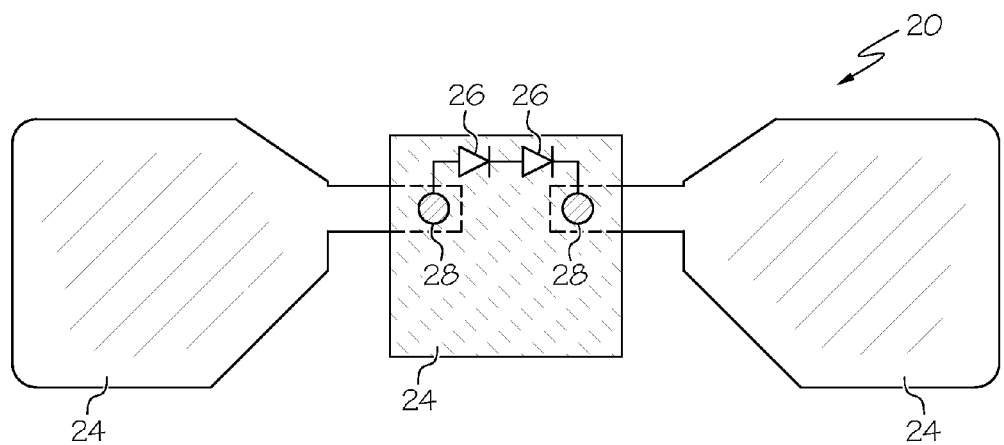
FIG. 1 is a diagrammatic plan view of an embodiment of components of an RFID assembly that includes an RFID chip having an internal assembly facilitation member in the form of ESD diodes.

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

This disclosure can be considered as an RFID chip used as a source of heat to cure an adhesive that is used to secure the RFID chip to another RFID component such as an antenna or strap during the manufacturing process of an RFID device. The RFID chip is internally heated and this RFID chip heat is transferred to the uncured adhesive in order to achieve the desired assembly. Direct wafer methods of transfer are practiced. Rapid assembly is accomplished by a simple "pick, flip place and cure action.

In embodiments, current cannot flow through the RFID chip until there is contact between the components being assembled, such as between mounting pads or other interfacing members. In this approach, the initial flow of current through the chip and the other component being assembled thereto demonstrates a low-resistance joint, at which point conditions are developed that are necessary to produce sufficient heat to cure the adhesive and achieve the desired assembly. The electrical characteristics of the RFID chip itself are used as a source of energy to heat a joint to cause adhesive curing and assembly. Other aspects incorporate a sensor approach for monitoring the assembly process, particularly the heat generated as indicated by voltage level or temperature that is recognized and used for monitoring and control.

On a broad scale, the embodiments of the disclosure use power dissipation inside of the RFID chip that is being attached to another RFID component in order to cure the adhesive material being used to attach the RFID components together. The component or components for attachment to the RFID chip according to this disclosure include an antenna component or a strap or interposer component. Internal electrically generated heating of the RFID chip itself is utilized to cure the attachment adhesive. Chips are primarily silicon, a relatively lightweight element, having a mass per volume of 2.33 g/cm$^3$ (or 2.33 g/$10^{12}$ um$^3$). Therefore, a chip of a typical size has 400 um×400 um×150 um dimensions and is 2.4×$10^7$ um$^3$ or a mass of 5.6×$10^{-5}$ gram. The heat capacity of silicon is 0.712 J/g/k, meaning for a chip of this size, the value of 4×$10^{-5}$ J/k is determined. Therefore, assuming the need to heat the chip by 150 k in 0.1 second, 6×$10^{-3}$ J are needed, indicating the need for 60 mW of heat energy to achieve the needed heating.

In an embodiment as disclosed herein, heating is achieved by passing electrical current through a pair of diodes that are part of the electrostatic discharge ("ESD") structure in the RFID chip. A typical voltage drop for such a structure is 1.4V, indicating the need for appropriately 43 mA of current. With this approach, the ESD diodes are used as an internal RFID chip source of heat for curing adhesive into an effective assembly joint.

Figure 2:
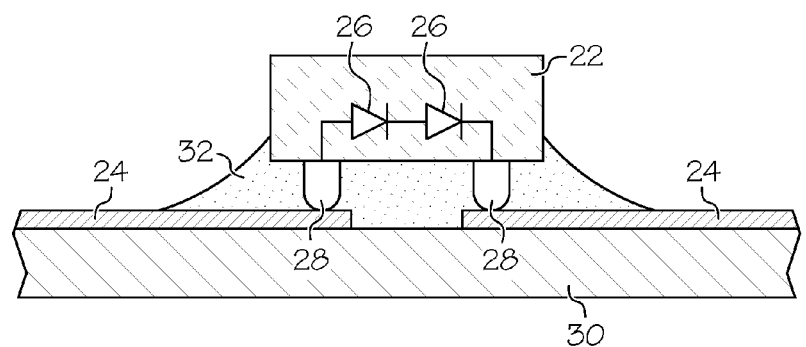
FIG. 2 is a diagrammatic side or elevation view of the assembly that is illustrated in FIG. 1.

FIG. 1 and FIG. 2 illustrate an embodiment of an RFID assembly, generally designated at 20, according to the present disclosure. This embodiment includes an RFID chip 22. Also illustrated is another RFID component 24, such as an RFID antenna or strap, shown in two sections in FIG. 1. Internal ESD diodes 26 are illustrated, same being shown in operative electrical communication with respective contacts 28, typically taking the form of tiny projections or "bumps" of highly conductive material such as copper, silver, etc.

Another RFID component 24 can be a strap lead associated with a substrate 30. The RFID component 24 can be an antenna, an antenna part or other component needing to be in secure electronic attachment with the RFID chip during manufacturing of a device having RFID capabilities. Suitable securement can be provided by an adhesive joint 32. In the case of the present disclosure and this embodiment, joint 32 is formed from uncured adhesive to which heat is applied that emanates from the RFID chip itself.

The RFID chip 22 has had its two contacts 28 placed into contact with a strap, the chip having been pushed into the uncured adhesive. A typical adhesive for these types of applications is an epoxy adhesive, particularly one that cures into its set form by the application of heat to the uncured epoxy adhesive. More particularly, a voltage is present between the two halves of the strap substrate as shown in FIG. 1 and FIG. 2, such that, when the chip is in contact with the substrate, an electrical current flows through the chip, generating heat and curing the adhesive into the adhesive joint 32. Heat is generated by operation of the internal ESD diodes as generally discussed herein. Typically, the heat is generated by the sudden flow of electricity at or between the internal ESD diodes 26. The discharge occurs when the differently-charged objects of the RFID chip and the substrate are brought together through the contacts, releasing the energy associated with the internal ESD diodes, resulting in generation of heat as discussed herein.

Figure 3:
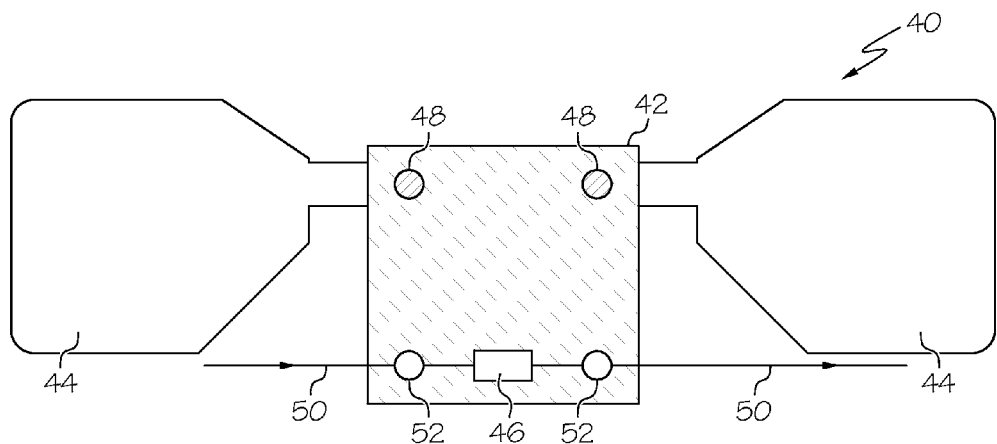
FIG. 3 is a diagrammatic plan view of another embodiment of an RFID chip that has an internal assembly facilitation member in the form of a resistor.

Another embodiment is illustrated in FIG. 3, showing an RFID chip assembly generally designated at 40. RFID chip 42 and another RFID component 44 are provided. The RFID chip 42 has contacts 48 designated for test points with a resistor in the chip connected across them. This approach includes a metal layer 46 with electrical current-passing abilities, schematically illustrated at 50, flowing through ground locations 52. Resistor heating imparts heat internally to the RFID chip 42 and thus to an uncured adhesive that sets in response heat applied thereto in order to form an adhesive joint of the general type shown in FIG. 2. As an example, current 50 can be applied externally of the chip in order to develop the necessary heating. As with other embodiments herein, this embodiment also avoids the need for a heat source external of the RFID chip, such as through the use of thermodes, to cure the adhesive. This illustrated embodiment achieves adhesive curing more rapidly than through the use of thermodes, which heat from the outside of the RFID chip.

Figure 4:
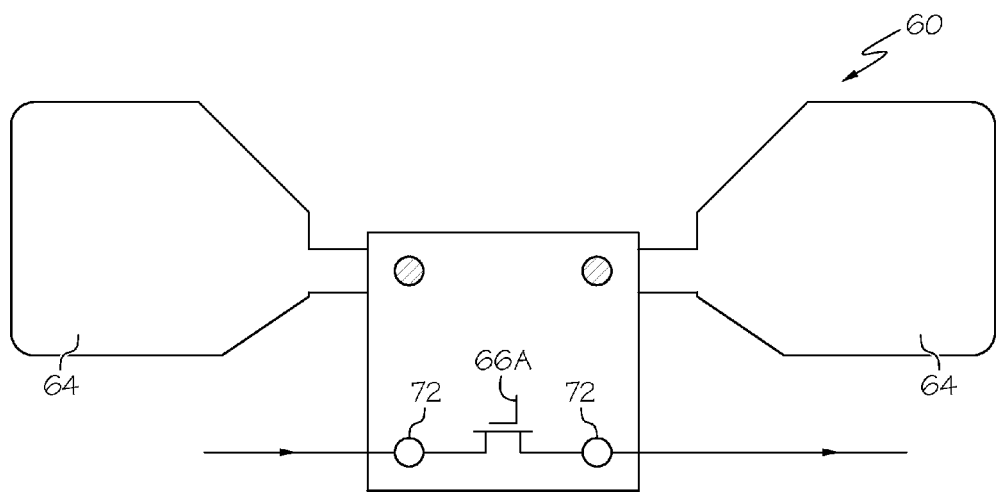
FIG. 4 is a diagrammatic plan view of a further embodiment of an RFID chip that has an internal assembly facilitation member in the form of a FET.

A further embodiment is illustrated in FIG. 4, taking the form of an RFID chip assembly, generally designated at 60. This includes an RFID chip 62 and another RFID component 64. A plurality of contacts 68 join these two components by way of an adhesive joint by transforming an uncured adhesive as generally discussed herein into a set joint. This approach utilizes a chip positioned field-effect transistor (FET). The FET embodies semiconductor technology and controls the flow of electrons for a conductive channel with voltage applied, which current flow is used for generating internal heat in the RFID chip that moves out of the RFID chip. This FET 66 is controlled by the RFID chip 62. Similar to the embodiment of FIG. 3, current 70 and ground locations 72 cooperate with the RFID chip in order to provide internal heat for the RFID chip and in order to achieve rapid curing of uncured adhesive by operation of heat being generated within the RFID chip which is transferred to and applied directly to the uncured adhesive.

Figure 4A:
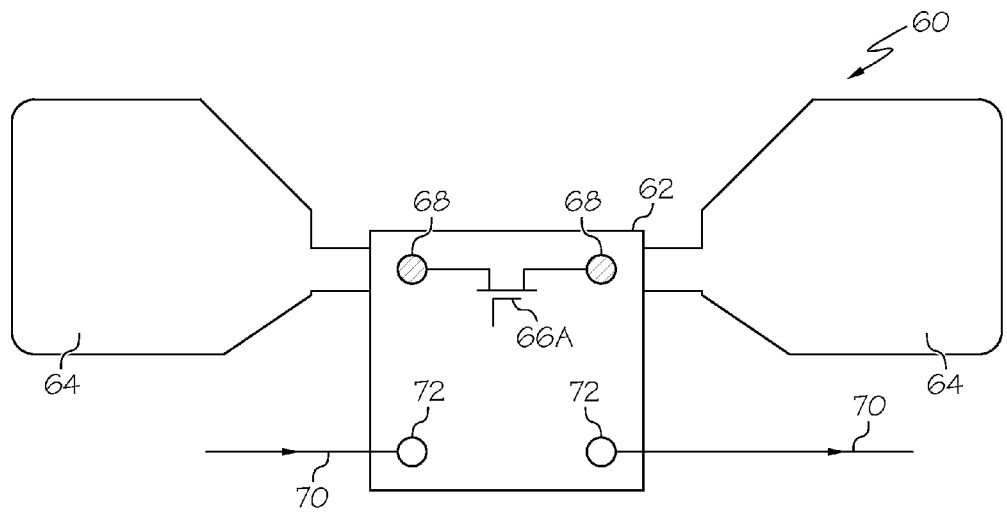
FIG. 4A is a diagrammatic plan view of a further embodiment of an RFID chip that has an internal assembly facilitation member in the form of a FET.

A still further embodiment is illustrated in FIG. 4A, taking the form of an RFID chip assembly, generally designated at 60. In all cases where a DC or AC voltage is applied to the chip, that voltage may provide power to the RFID chips internal circuits, allowing it to act in a defined manner. For example, an FET or other switch does already exist in most RFID chips designed to modulate its input impedance to respond to a reader; this FET may be designed to become active if the chip is powered by a DC signal above a certain voltage threshold, rather than the rectified AC that powers the chip in use, providing a path for the heating current. This includes an RFID chip 62 and another RFID component 64. A plurality of contacts 68 join these two components by way of an adhesive joint by transforming an uncured adhesive as generally discussed herein into a set joint. This approach utilizes a chip positioned field-effect transistor (FET). The FET embodies semiconductor technology and controls the flow of electrons for a conductive channel with voltage applied, which current flow is used for generating internal heat in the RFID chip that moves out of the RFID chip. This FET 66A is controlled by the RFID chip 62. Similar to the embodiment of FIG. 3, current 70 and ground locations 72 cooperate with the RFID chip in order to provide internal heat for the RFID chip and in order to achieve rapid curing of uncured adhesive by operation of heat being generated within the RFID chip which is transferred to and applied directly to the uncured adhesive. In this particular embodiment, the FET is switched on when a DC signal is received that is above a threshold, as a DC voltage is not applied during normal operation.

Figure 5:
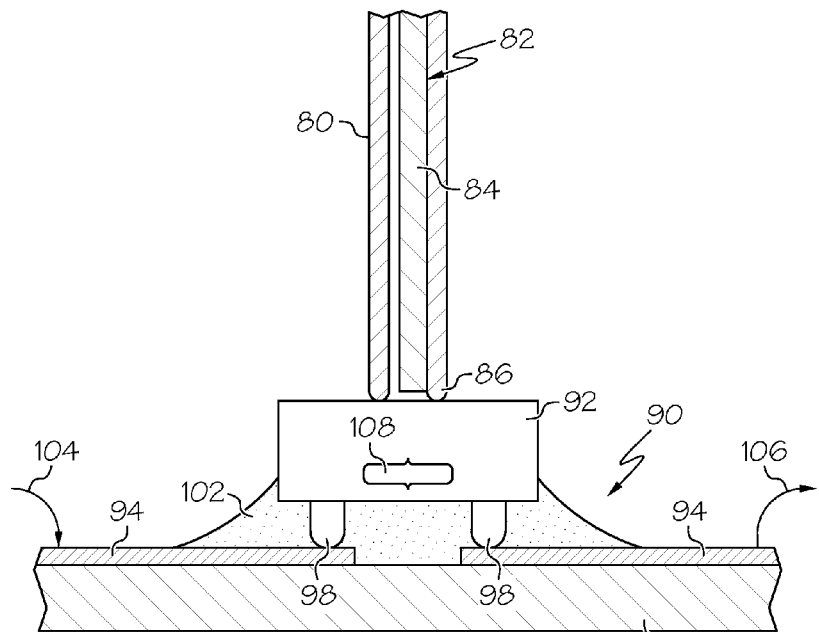
FIG. 5 is a diagrammatic side or elevation view of an added embodiment of components of an RFID assembly that achieves parameter monitoring.

A further embodiment is illustrated in FIG. 5 that utilizes the diode forward voltage drop to measure the temperature of the diode and indicate temperature information for the RFID chip. This provides sensor action which can be used to monitor the progression of the formation of the adhesive joint and thus of the attachment process.

A typical silicon RFID chip has a temperature coefficient that is approximately $-2$ mV/k, providing for a self-regulating chip attachment process. As noted previously, the current begins to flow when contact is made. Power dissipation is maintained until the forward voltage, for a typical two-diode system, drops from its initial state by a given amount, at which point the current can be maintained to hold a steady state. The extent of this dropping from its initial state is, for example, 0.6V (150 k×$-2$ mV for two diodes).

Measurement of chip diode voltage is applicable to forms of heating other than those of FIG. 1 through FIG. 4. This is illustrated in FIG. 5 or in the form of heating that embodies actinic radiation such as that provided by a near-infrared ("NIR") light associated with a tool, generally designated at 80, that applies vacuum to the chip in order to transport and hold same, such as during assembly of an RFID chip assembly 90 when the nozzle of the tool has an open space within which is positioned a light source 82. An example of a suitable arrangement is that of an optical fiber 84 positioned within the vacuum tool 80 and connected to an NIR source (not shown).

The tip 86 of the tool 80 is in engagement with the chip 92 for purposes of placing the chip onto another RFID component 94, typically on the substrate as illustrated. The RFID chip 92, typically through contacts 98, engage the RFID contact 94 such as strap pads including a substrate 100 of suitable material such as polyethylene terephthalate ("PET"). An uncured adhesive is positioned at the juncture between these components. The light source 82 imparts heat to the RFID chip 92 which in turn increases the temperature of the adhesive, thereby forming adhesive joint 102. Monitoring current is illustrated at 104, and sensing current is illustrated at 106. With the light source 82 applying energy when the components are in engagement with each other as shown in FIG. 5, the light is applied (for example light energy is initiated and it continues to supply energy until the RFID chip reaches the desired temperature). This heating can be determined by measuring the chip diode voltage.

Alternatively, an inbuilt temperature sensor 108 can be provided, such as positioned on or in the RFID chip 92 to monitor temperature and thus monitor heat development internal of the chip 92, thereby allowing monitoring of heat applied by the chip to the uncured adhesive, such being accomplished in the absence of a thermode. The current can be maintained to hold a steady state for proper adhesive curing and formation of the set adhesive joint 102.

Various embodiments of this disclosure follow a technique that is particularly advantageous in that the current does not flow until the bond pads or contacts on the RFID chip are definitely in contact with the other RFID component, such as RFID strap or RFID antenna pads. Therefore, feedback control of the chip placement is implemented. For example, a chip attachment system, such as one using a vacuum tool or other placement approach, pushes the RFID chip into contact with the other RFID component until current begins to flow at the correct level, showing that a low resistance joint has been achieved between the RFID chip contacts and the other RFID component. With this chip-internal approach of the present disclosure, this attachment implementation occurs exactly when the uncured adhesive needs to be cured, including when the RFID components are properly positioned and are in contact with each other. This action occurs automatically when this contact is achieved, there being no need to detect contact and then apply thermodes and pressure as practiced heretofore.

It will be understood that the embodiments described above are illustrative of some of the applications of the principles of the present subject matter. Numerous modifications may be made by those skilled in the art without departing from the spirit and scope of the claimed subject matter, including those combinations of features that are individually disclosed or claimed herein. For these reasons, the scope hereof is not limited to the above description but is as set forth in the following claims, and it is understood that claims may be directed to the features hereof, including as combinations of features that are individually disclosed or claimed herein.

The invention claimed is:

1. A method of assembling RFID components together, comprising:
    associating with an RFID chip a member having a chip diode built into the RFID chip and an electrical characteristic that imparts heat by electrical action internal of the RFID chip;
    providing at least one other RFID component adapted to be assembled together with the RFID chip;
    positioning an uncured adhesive into contact with the RFID chip and with the RFID antenna component; and
    generating electrical current by action of the member having an electrical characteristic, thereby heating the uncured adhesive and thus curing same into a cured adhesive joint,
    focusing an external source of energy onto the RFID chip, measuring the voltage of the chip diode for monitoring data for threshold heat level developing, and transmitting the data to control the external source of energy; and
    whereby the RFID chip and the other RFID component are assembled together by the cured adhesive joint.

2. The method in accordance with claim 1, wherein the member having an electrical characteristic comprises at least one internal electrostatic discharge (ESD) diode of the RFID chip.

3. The method in accordance with claim 1, wherein the member having an electrical characteristic comprises at least one resistor connected across RFID chip contacts.

4. The method in accordance with claim 1, wherein the member having an electrical characteristic comprises at least one FET of the RFID chip.

5. The method in accordance with claim 1, further including dissipating power inside the RFID chip by operation of the member having an electrical characteristic.

6. The method in accordance with claim 1, wherein the assembling proceeds in the absence of curing action besides internal heating of the RFID chip by action of the source of energy.

7. The method in accordance with claim 1, wherein the other RFID component is an RFID antenna component.

8. The method in accordance with claim 1, wherein the member having an electrical characteristic is internal of the RFID chip.

9. The method in accordance with claim 1, wherein the member having an electrical characteristic comprises at least one internal electrostatic discharge (ESD) diode of the RFID chip.

10. An RFID assembly comprising:
    an RFID chip with a member having an electrical characteristic that imparts heat by electrical action internal of the RFID chip wherein the member comprises at least one chip diode;
    at least one other RFID component assembled with the RFID chip by a cured adhesive joint;
    an external energy source focused on the RFID chip; and
    the cured adhesive joint had been formed from an uncured adhesive in contact with the RFID chip and the other RFID component, the uncured adhesive having been cured with heat from the RFID chip by action of the member having an electrical characteristic to generate electrical current.

11. The RFID assembly in accordance with claim 10, wherein the at least one diode is an internal electrostatic discharge (ESD) diode of the RFID chip.

12. The RFID assembly in accordance with claim 10, wherein the member having an electrical characteristic comprises at least one resistor connected across RFID chip contacts.

13. The RFID assembly in accordance with claim 10, wherein the member having an electrical characteristic comprises at least one FET of the RFID chip.

14. The RFID assembly in accordance with claim 10, wherein the member having an electrical characteristic dissipates power inside the RFID chip.

15. The RFID assembly in accordance with claim 10, wherein the other RFID component is an RFID antenna component.

16. A method of assembling RFID components together, comprising:
    providing an RFID chip associated with a member having a chip diode built into the RFID chip and an electrical characteristic that internally heats the RFID chip by electrical action of that member;
    providing the RFID chip with an inbuilt temperature sensor;
    providing at least one other RFID component adapted to be assembled with the RFID chip;
    positioning an uncured adhesive into contact with the RFID chip and with the other RFID component;
    heating the RFID chip by action of the member having an electrical characteristic to generate electrical current and monitoring the temperature of the RFID chip for reaching of a threshold temperature needed for adequate heating the uncured adhesive into a cured adhesive joint,
    focusing an external source of energy onto the RFID chip and ceasing this focusing when the threshold temperature is achieved; and
    whereby the RFID chip and the other RFID component are assembled together by the cured adhesive joint.

17. The method in accordance with claim 16, further including focusing an external source of energy onto the RFID chip and ceasing this focusing when the threshold temperature is achieved.

18. The method in accordance with claim 17, wherein the external source of energy is an actinic radiation source delivered by action of a chip placement device.

* * * * *